(12) United States Patent
Ebata et al.

(10) Patent No.: US 12,139,787 B2
(45) Date of Patent: Nov. 12, 2024

(54) APPARATUS AND METHOD FOR CLEANING REACTION VESSEL FOR PROCESSING SUBSTRATE

(71) Applicant: KOKUSAI ELECTRIC CORPORATION, Tokyo (JP)

(72) Inventors: Shinya Ebata, Toyama (JP); Koei Kuribayashi, Toyama (JP); Takaaki Noda, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 1047 days.

(21) Appl. No.: 17/030,891

(22) Filed: Sep. 24, 2020

(65) Prior Publication Data

US 2021/0087678 A1 Mar. 25, 2021

(30) Foreign Application Priority Data

Sep. 25, 2019 (JP) .................................. 2019-174034

(51) Int. Cl.
*C23C 16/44* (2006.01)
*C23C 16/455* (2006.01)
(Continued)

(52) U.S. Cl.
CPC .... *C23C 16/4405* (2013.01); *C23C 16/45502* (2013.01); *C23C 16/45544* (2013.01);
(Continued)

(58) Field of Classification Search
None
See application file for complete search history.

(56) References Cited

U.S. PATENT DOCUMENTS 5,207,573 A * 5/1993 Miyagi .................... C21D 1/34
432/152
8,679,259 B2 3/2014 Kameda et al.
(Continued)

FOREIGN PATENT DOCUMENTS

JP 04-350168 A 12/1992
JP 2003-059915 A 2/2003
(Continued)

OTHER PUBLICATIONS

Singapore Written Opinion issued on Sep. 10, 2021 for Singapore Patent Application No. 10202009402T.
(Continued)

*Primary Examiner* — Binu Thomas
(74) *Attorney, Agent, or Firm* — Volpe Koenig

(57) ABSTRACT

There is provided a technique that includes a reaction vessel including a first region in which a substrate is arranged and a second region in which no substrate is arranged; a heater configured to heat the first region; a gas supplier configured to supply a plurality of gases including cleaning gases; and a controller that controls at least one selected from the group of the gas supplier, the heater, and a cooler to clean the first region and the second region under different conditions by at least one method selected from the group of a method in which the gas supplier supplies two different kinds of cleaning gases, a method in which the gas supplier supplies one or more cleaning gases from two different locations, and a method in which the heater sets a temperature differently between the first region and the second region.

14 Claims, 11 Drawing Sheets

(51) Int. Cl.
  *C23C 16/46* (2006.01)
  *C23C 16/52* (2006.01)
  *H01L 21/02* (2006.01)
(52) U.S. Cl.
  CPC .. *C23C 16/45574* (2013.01); *C23C 16/45578* (2013.01); *C23C 16/46* (2013.01); *C23C 16/52* (2013.01); *H01L 21/0217* (2013.01); *H01L 21/02271* (2013.01)

(56) References Cited

U.S. PATENT DOCUMENTS

| | | | |
|---|---|---|---|
| 9,401,272 | B2 | 7/2016 | Terasaki et al. |
| 9,982,347 | B2 | 5/2018 | Yamaguchi et al. |
| 10,998,205 | B2* | 5/2021 | Miyashita ......... H01L 21/67109 |
| 2005/0082002 | A1 | 4/2005 | Sato et al. |
| 2005/0090123 | A1 | 4/2005 | Nishimura et al. |
| 2006/0065289 | A1* | 3/2006 | Tamaoki ............... B08B 7/0035 |
| | | | 118/715 |
| 2007/0075086 | A1* | 4/2007 | Honma ................. C30B 31/10 |
| | | | 257/E21.285 |
| 2009/0314309 | A1 | 12/2009 | Sankarakrishnan et al. |
| 2010/0012273 | A1 | 1/2010 | Sankarakrishnan et al. |
| 2013/0065402 | A1* | 3/2013 | Kameda ..................... B08B 9/08 |
| | | | 118/724 |
| 2013/0213574 | A1 | 8/2013 | Sankarakrishnan et al. |
| 2014/0076236 | A1 | 3/2014 | Sankarakrishnan et al. |
| 2014/0248783 | A1* | 9/2014 | Kameda ............... C23C 16/4405 |
| | | | 118/697 |
| 2014/0287594 | A1* | 9/2014 | Terasaki ............ C23C 16/45561 |
| | | | 438/770 |
| 2015/0031216 | A1 | 1/2015 | Akae et al. |
| 2015/0140835 | A1* | 5/2015 | Tateno ............. H01L 21/67109 |
| | | | 118/724 |
| 2016/0084400 | A1 | 3/2016 | Sankarakrishnan et al. |
| 2017/0260626 | A1* | 9/2017 | Nagato ............. C23C 16/45527 |
| 2019/0127848 | A1* | 5/2019 | Nagato ............. H01L 21/67109 |

FOREIGN PATENT DOCUMENTS

| | | |
|---|---|---|
| JP | 2005-101583 A | 4/2005 |
| JP | 2011-233570 A | 11/2011 |
| JP | 2014-209572 A | 11/2014 |
| JP | 2017-168496 A | 9/2017 |
| JP | 2018-026460 A | 2/2018 |
| TW | 201009977 A | 3/2010 |
| WO | 2017/212728 A1 | 12/2017 |

OTHER PUBLICATIONS

Singapore Search Report issued on Sep. 10, 2021 for Singapore Patent Application No. 10202009402T.

Korean Office Action for Korean Application No. 10-2020-0122844, dated Jun. 21, 2022. 5 pages.

Taiwanese Office Action issued on Jun. 23, 2021 for Taiwanese Patent Application No. 109129548.

Japanese Office Action issued on Aug. 3, 2021 for Japanese Patent Application No. 2019-174034.

Written Opinion issued on Jul. 24, 2022 by the Intellectual Property Office of Singapore for Singapore Patent Application No. 10202009402T.

\* cited by examiner

APPARATUS AND METHOD FOR CLEANING REACTION VESSEL FOR PROCESSING SUBSTRATE

CROSS-REFERENCE TO RELATED APPLICATION(S)

This application is based upon and claims the benefit of priority from Japanese Patent Application No. 2019-174034, filed on Sep. 25, 2019, the entire contents of which are incorporated herein by reference.

TECHNICAL FIELD

The present disclosure relates to a substrate processing apparatus, and a method of manufacturing a semiconductor device.

BACKGROUND

As an example of a process of manufacturing a semiconductor device, a film-forming process of forming a film on a substrate is often performed by supplying a precursor gas or a reaction gas to the substrate in a process chamber. When the film-forming process is performed, deposits may be adhered to the interior of the process chamber. Therefore, a cleaning process may be performed to remove the deposits adhered to the interior of the process chamber by supplying a cleaning gas into the process chamber after performing the film-forming process.

SUMMARY

The present disclosure provides some embodiments of a technique capable of improving efficiency of a cleaning process.

According to one or more embodiments of the present disclosure, there is provided a technique that includes a reaction vessel including a first region in which a substrate is arranged and a second region in which no substrate is arranged; a heater configured to heat the first region; a gas supplier configured to supply a plurality of gases including cleaning gases that clean an interior of the reaction vessel; and a controller that controls at least one selected from the group of the gas supplier, the heater, and a cooler to clean the first region and the second region under different conditions by at least one method selected from the group of a method in which the gas supplier supplies two different kinds of cleaning gases, a method in which the gas supplier supplies one or more cleaning gases from two different locations, and a method in which the heater sets a temperature differently between the first region and the second region.

BRIEF DESCRIPTION OF DRAWINGS

The accompanying drawings, which are incorporated in and constitute a part of the specification, illustrate embodiments of the present disclosure.

DETAILED DESCRIPTION

Figure 1:
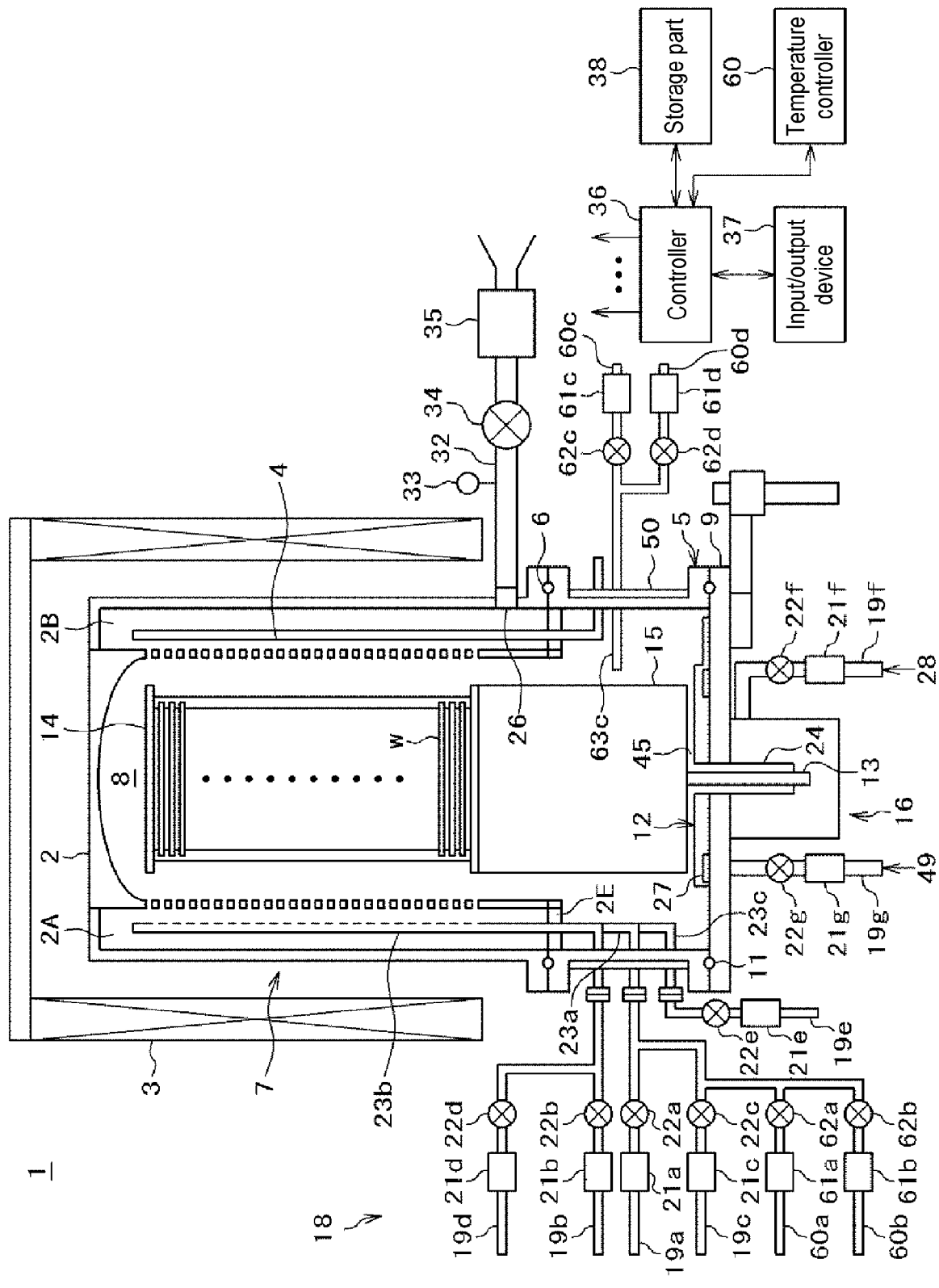
FIG. 1 is a vertical cross sectional view illustrating an outline of a vertical type process furnace of a substrate processing apparatus.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One or more embodiments of the present disclosure will now be described with reference to FIGS. 1 to 10. A substrate processing apparatus 1 is configured as an example of an apparatus used in a manufacturing process of a semiconductor device.

The substrate processing apparatus 1 includes a ceiling with its upper end closed, a cylindrical reaction tube 2, which has an opening that is opened to its lower end and vertically extends, and a heater 3 as a heating means (heating mechanism) installed at the outer periphery of the reaction tube 2. The reaction tube 2 is made of, e.g., quartz ($SiO_2$), silicon carbide (SiC), or the like. A temperature detector 4 is installed at the reaction tube 2. The temperature detector 4 is erected along the inner wall of the reaction tube 2.

An inlet flange (manifold) 5, which will be described later, is connected to a lower end opening of the reaction tube 2 via a seal member 6 such as an O-ring or the like so as to support the lower end of the reaction tube 2. The inlet flange 5 is made of metal such as, e.g., stainless steel or the like. A process vessel 7 as a reaction vessel is formed by the reaction tube 2 and the inlet flange 5. A process chamber 8 configured to process wafers W as substrates is formed in the process vessel 7.

In addition, the reaction tube 2 includes a supply buffer chamber 2A and an exhaust buffer chamber 2B formed to face each other so as to protrude outward (radially). The supply buffer chamber 2A is partitioned into a plurality of spaces by partition walls vertically extending. A nozzle 23a, a nozzle 23b, and a nozzle 23c are respectively installed at respective sections of the supply buffer chamber 2A. A boundary wall between the supply buffer chamber 2A and the exhaust buffer chamber 2B and the process chamber 8 is formed to have the same inner diameter as the inner diameter of the reaction tube 2 in a place at which the supply buffer chamber 2A or the like is not installed, by which the periphery of the wafers W is surrounded by a wall concentric with the wafers W. A plurality of slits, which communicate both sides of the boundary wall, are installed at the boundary wall. An opening 2E for inserting and removing the nozzle 23a, the nozzle 23b, and the nozzle 23c is formed under the supply buffer chamber 2A. The opening 2E is formed to have substantially the same width as that of the supply buffer chamber 2A. Furthermore, since it is difficult to eliminate a gap between the opening 2E and the base portions of the nozzles 23a, 23b, and 23c regardless of the shape of the opening 2E, a gas can flow in and out of the supply buffer chamber 2A via the gap.

The process chamber 8 stores a boat 14 as a substrate support configured to support a plurality of wafers W, e.g., 25 to 150 wafers, arranged at predetermined intervals, along a vertical direction in a shelf shape. The boat 14 is made of, e.g., quartz, SiC or the like, and is supported above a heat-insulating structure 15. The substrate support includes the boat 14 and the heat-insulating structure 15. The interior of the process vessel 7 is divided into a first region including a region in which the wafers W are arranged, and a second region including a region surrounded by the inlet flange.

The outer shape of the heat-insulating structure 15 is columnar, and it is supported by a rotary shaft 13 penetrating a lid portion 9. The rotary shaft 13 coincides with a tube axis of the reaction tube 2, and is connected to a rotation mechanism 16 installed on the lower surface of the lid portion 9. For example, a magnetic fluid seal is installed in a portion of the rotary shaft 13 penetrating the lid portion 9, in which the rotary shaft 13 is configured to be rotated, with the interior of the reaction tube 2 hermetically sealed. When the rotary shaft 13 is rotated, the heat-insulating structure 15 and the boat 14 are integrally rotated. The lid portion 9 is vertically driven by a boat elevator 17 as an elevator. The substrate support and the lid portion 9 are integrally moved up and down by the boat elevator 17 such that the boat 14 is loaded and unloaded via the opening of the reaction tube 2. That is, the reaction tube 2 is configured to accommodate the boat 14 so as to take it in and out via the opening, and the lid portion 9 is configured to close the lower end opening of the inlet flange 5 so as to take the boat 14 in and out.

The substrate processing apparatus 1 includes a gas supply mechanism 18 configured to supply a precursor gas, a reaction gas, an inert gas, and a cleaning gas as processing gases used for substrate processing into the process chamber 8. The processing gases supplied by the gas supply mechanism 18 are selected according to a kind of a film to be formed. In the present embodiments, the gas supply mechanism 18 includes a precursor gas supply part, a reaction gas supply part, an inert gas supply part, a first purge gas supply part, a second purge gas supply part, and a cleaning gas supply part.

The precursor gas supply part includes a gas supply pipe 19a. A mass flow controller (MFC) 21a, which is a flow rate controller (flow rate control part), and a valve 22a, which is an opening/closing valve, are installed at the gas supply pipe 19a sequentially from the corresponding upstream side. A downstream end of the gas supply pipe 19a is connected to the nozzle 23a which penetrates a sidewall of the inlet flange 5. The nozzle 23a is erected inside the reaction tube 2 vertically (in parallel to the tube axis) along the inner wall of the reaction tube 2, in which a plurality of supply holes 24a opened toward the wafers W supported by the boat 14 are formed. A precursor gas is supplied to the wafers W in a direction perpendicular to the tube axis via the supply holes 24a of the nozzle 23a.

Next, a reaction gas is similarly supplied from the reaction gas supply part to the wafers W in the direction perpendicular to the tube axis via a gas supply pipe 19b, a MFC 21b, a valve 22b, a nozzle 23b, and a supply hole 24b. An inert gas is supplied from the inert gas supply part to the wafers W in the direction to the tube axis via gas supply pipes 19c, 19d, and 19e, MFCs 21c, 21d, and 21e, valves 22c, 22d, and 22e, the nozzles 23a, 23b, and 23c, and the supply holes 24a, 24b, and 24c.

The first purge gas supply part includes a gas supply pipe 19f. A MFC 21f and a valve 22f are installed at the gas supply pipe 19f sequentially from the corresponding upstream side. A downstream end of the gas supply pipe 19f is connected to a hollow portion 24 formed around the rotary shaft 13. The hollow portion 24 is sealed by a magnetic fluid seal before a bearing and is opened to its upper end, i.e., to the interior of the reaction tube 2. Furthermore, a space communicating from the hollow portion 24 to an upper surface of a protection plate 12 is formed, in which the space is continuous with a gap 45 formed between the heat-insulating structure 15 and the protection plate 12 to form a first purge gas flow path. A first purge gas 28 supplied from the first purge gas supply part in this way is supplied to a lower portion of the process vessel 7, which is a furnace opening, while purging the gap 45. That is, the first purge gas 28 purges the periphery of the rotary shaft 13 in the upstream and the furnace opening in the downstream, and is finally discharged from an exhaust port 26 formed at the lower end of the reaction tube 2. The purge gas may also be any gas which does not react with the precursor gas or the reaction gas.

The second purge gas supply part includes a gas supply pipe 19g. A MFC 21g and a valve 22g are installed at the gas supply pipe 19g sequentially from the corresponding upstream side. A second purge gas supply port, which penetrates the lid portion 9, is formed on an upper surface of the lid portion 9 at the downstream end of the gas supply pipe 19g. Therefore, the second purge gas supply port is formed on the upper surface of the lid portion 9 and is opened to a second purge gas flow path 27. The opening position of the second purge gas supply port is near the nozzles 23a, 23b, and 23c. The second purge gas flow path 27 has an annular shape or a substantially annular shape (loop shape), and is concentrically formed on a lower surface of the protection plate 12. A second purge gas 49 supplied into the second purge gas flow path 27 leaks from a gap 46 (see FIG. 2) between the protection plate 12 and the lid portion 9 to the surroundings, while flowing through the second purge gas flow path 27, and purges the upper surface of the lid portion 9 or the inlet flange 5.

The cleaning gas supply part includes gas supply pipes 60a and 60b connected to the gas supply pipe 19a, and a gas supply pipe 60c. A MFC 61a and a valve 62a are installed at the gas supply pipe 60a sequentially from the corresponding upstream side. The nozzle 23a as a first nozzle is connected to a leading end portion of the gas supply pipe 60a via the gas supply pipe 19a. A MFC 61b and a valve 62b are installed at the gas supply pipe 60b sequentially from the corresponding upstream side. The nozzle 23a is connected to a leading end portion of the gas supply pipe 60b via the gas supply pipe 19a. A MFC 61c and a valve 62c are installed at the gas supply pipe 60c sequentially from the corresponding upstream side, and a gas supply pipe 60d is connected to the downstream side of the valve 62c. A MFC 61d and a valve 62d are installed at the gas supply pipe 60d sequentially from the corresponding upstream side. A nozzle 63c as a second nozzle is connected to a leading end portion of the gas supply pipe 60c. The nozzle 63c is a short pipe which horizontally extends from the inlet flange toward the tube axis, and is disposed near the exhaust buffer chamber 2B in plane view (see FIG. 6). The nozzle 63c includes two gas supply holes 64c which are opened in the circumferential direction of the reaction tube 2 near its leading end. Furthermore, in FIG. 1, the positions of the nozzles 23a, 23b, and 23c, the exhaust pipe 32, and the like are convenient for the sake of illustration.

An exhaust pipe 32 is installed to the exhaust port 26 formed on the outer wall of the exhaust buffer chamber 2B. A vacuum pump 35 as a vacuum exhaust device is connected to the exhaust pipe 32 via a pressure sensor 33 as a pressure detector (pressure detection part) which detects the internal pressure of the process chamber 8 and an APC (auto pressure controller) valve 34 as a pressure regulator (pressure regulation part). With this configuration, it is possible to allow the internal pressure of the process chamber 8 to be used as a processing pressure according to a process. The exhaust pipe 32 is installed at a position facing the nozzles 23a, 23b, and 23c.

A controller 36 is connected to the rotation mechanism 16, the boat elevator 17, and the MFCs 21a to 21g, the valves 22a to 22g, and the APC valve 34 of the gas supply mechanism 18 so as to control them. The controller 36 includes, for example, a microprocessor (computer) including a CPU, and is configured to control operations of the substrate processing apparatus 1. An input/output device 37 formed of, e.g., a touch panel or the like, is connected to the controller 36.

A storage part 38 as a storage medium is connected to the controller 36. A control program for controlling operations of the substrate processing apparatus 1, or a program for causing each component of the substrate processing apparatus 1 to execute a process according to the processing conditions is readably stored in the storage part 38.

The storage part 38 may be a memory device (a hard disk or a flash memory) built in the controller 36, or a portable external memory device (a magnetic tape, a magnetic disc such as a flexible disc or a hard disc, an optical disc such as a CD or a DVD, a magneto-optical disc such as a MO, or a semiconductor memory such as a USB memory or a memory card). Furthermore, the program may be supplied to the computer using a communication means such as the Internet or a dedicated line. The program is read from the storage part 38 according to an instruction or the like from the input/output device 37 as necessary, and the controller 36 executes a process according to the recipe thus read so that the substrate processing apparatus 1 performs a desired process under the control of the controller 36.

In addition, a temperature controller 60 which controls a heater 50 as a heating means installed on the outer peripheral surface of the inlet flange 5 is connected to the controller 36. In the temperature controller 60, a target temperature or the like is set by the controller 36 according to the recipe. For example, it is set at a temperature at which a byproduct can be suppressed from being adhered to the inlet flange 5 while at least a gas that may generate the byproduct that is a problem is supplied during a series of substrate processing or the process chamber 8 is filled with the gas.

Next, a configuration of the inlet flange 5, which is the furnace opening, and its peripheral portion will be described with reference to FIGS. 2 to 5.

Figure 2:
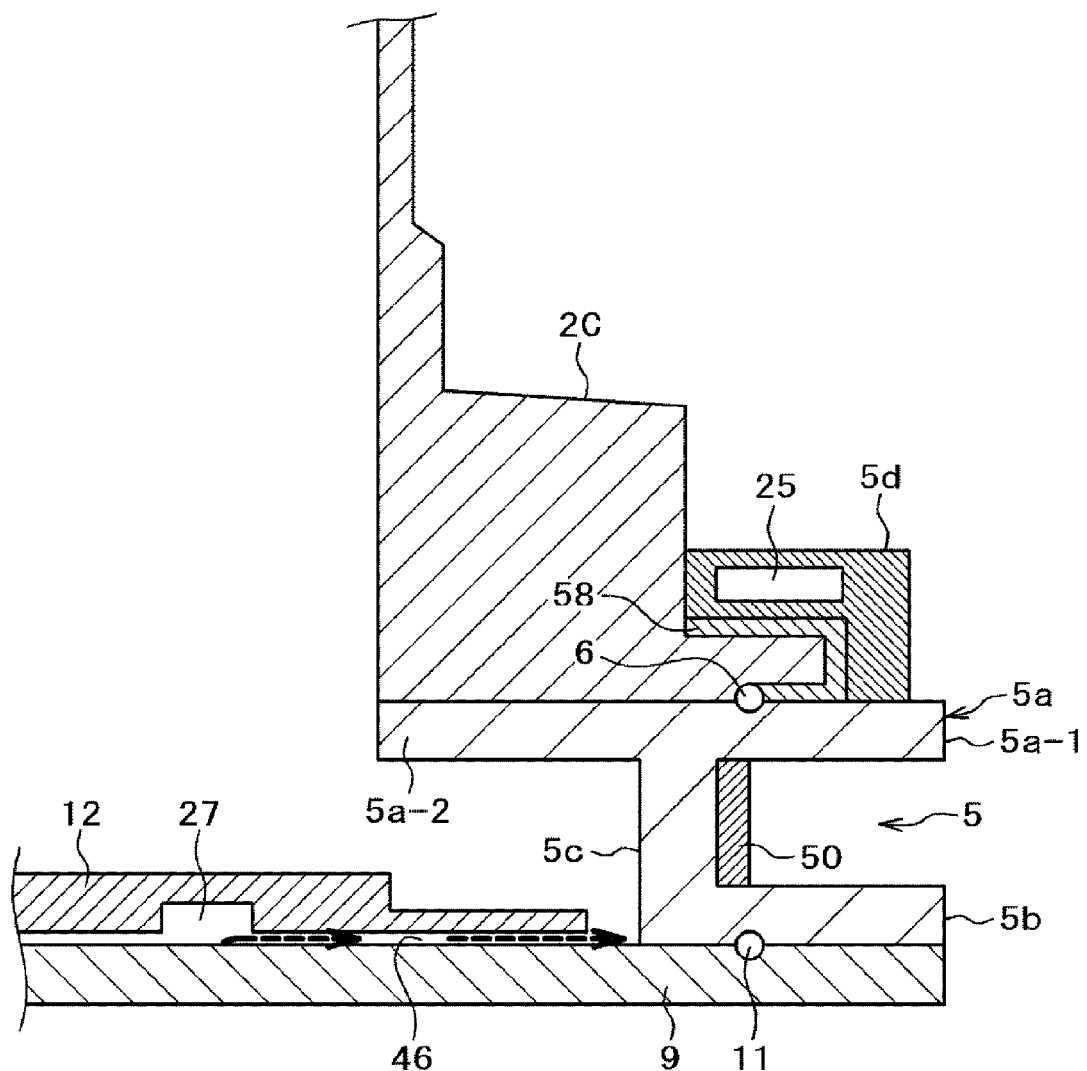
FIG. 2 is a vertical cross sectional view illustrating periphery of an inlet flange.

As illustrated in FIG. 2, the inlet flange 5 includes an upper flange 5a hermetically connected to a flange portion 2C at the lower end of the reaction tube 2 at its upper end, a lower flange 5b hermetically connected to the lid portion 9 at its lower end, and a cylindrical portion 5c connecting the upper flange 5a and the lower flange 5b.

The upper flange 5a includes an outer flange 5a-1 protruding from the cylindrical portion 5c in the outer peripheral direction and an inner flange 5a-2 protruding from the cylindrical portion 5c in the inner peripheral direction. The inner flange 5a-2 supports the cylindrical portion (inner tube) of the reaction tube 2 or the inner walls of the supply buffer chamber 2A and the exhaust buffer chamber 2B. The outer flange 5a-1 supports the leading end of the flange portion 2C of the reaction tube 2. The leading end of the flange portion 2C engages with a fastener 5d, in which the fastener 5d is bolted to the outer flange 5a-1 so as to be pressed against the seal member 6 such as an O-ring on the upper surface of the outer flange 5a-1. At this time, the fastener 5d is also thermally well coupled with the inlet flange 5.

The fastener 5d may be configured to be divided into two C-shaped members so as to engage with substantially the entire circumference of the flange portion 2C, except a place in which the exhaust pipe 32 is installed. The fastener 5d further includes a passage through which cooling water flows, and has a function of protecting the seal member 6 from high temperature. In addition, an elastic member 58 made of synthetic resin for cushioning or for enhancing heat transfer may be inserted between the fastener 5d and the flange portion 2C.

Furthermore, the lower end opening of the inlet flange 5 (the lower end opening of the process vessel 7) is opened and closed by the disc-shaped lid portion 9. A seal member 11 such as an O-ring is installed on the upper surface of the lid portion 9 so that the reaction tube 2 and the outside air are hermetically sealed by the seal member 11.

Figure 3:
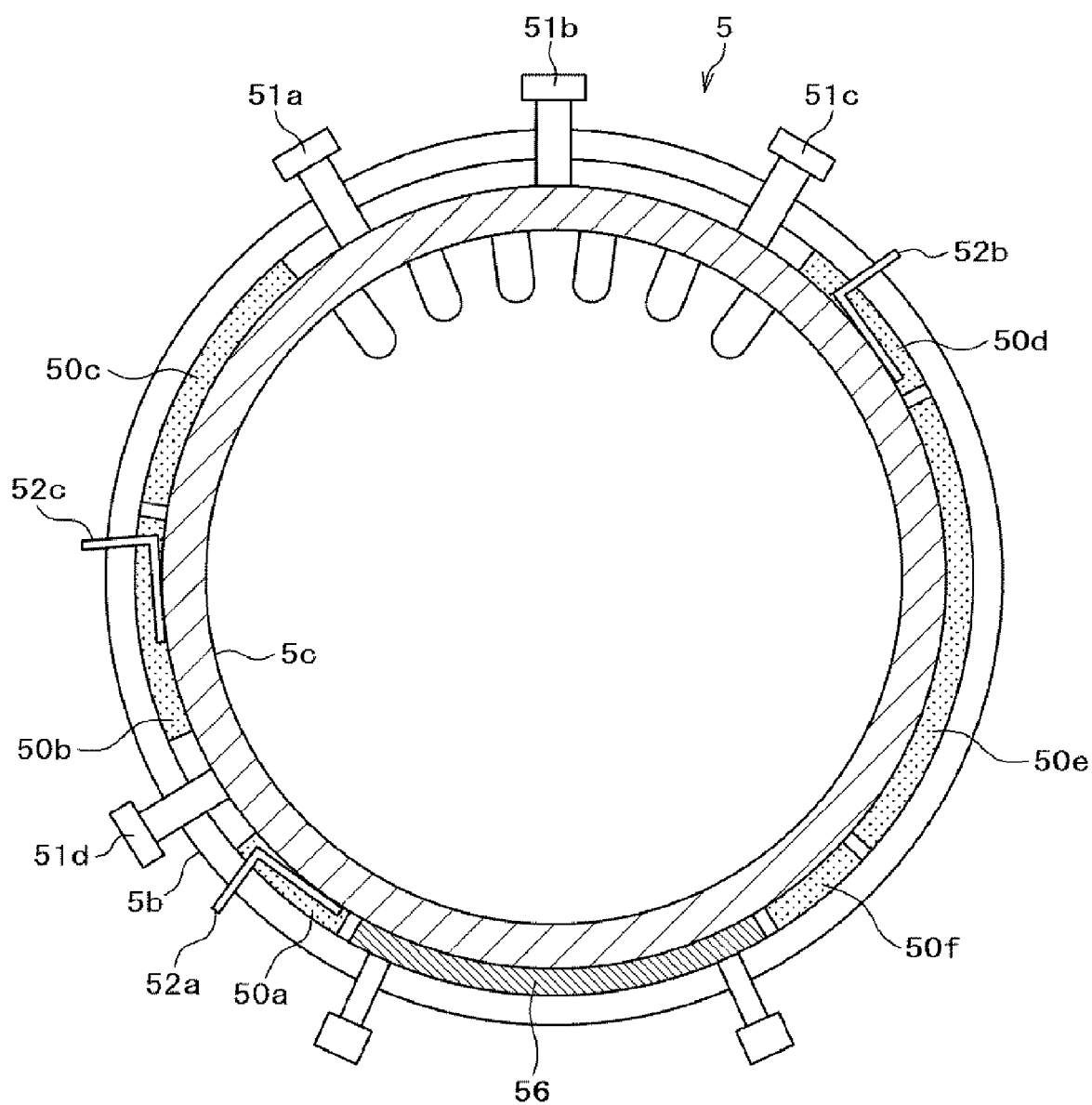
FIG. 3 is a cross sectional view illustrating a state where heater elements are installed in the inlet flange.

Furthermore, as illustrated in FIG. 3, four gas introduction ports 51a, 51b, 51c, and 51d are included on the outer peripheral surface of the cylindrical portion 5c of the inlet flange 5. The gas supply pipes 19a, 19b, 19e, and 60c are connected to the gas introduction ports 51a, 51b, 51c, and 51d, respectively. In addition, the nozzles 23a, 23b, 23c, and 63c are respectively installed at the inner peripheral surface side of the inlet flange 5 of the gas introduction ports 51a, 51b, 51c, and 51d. On both sides of each of the nozzles 23a, 23b, and 23c, members for supporting them are installed so as to protrude from the inner peripheral surface of the flange toward the center thereof.

Furthermore, the heater 50, which heats the inlet flange 5 from the outer peripheral surface side, is installed on the outer peripheral surface of the cylindrical portion 5c of the inlet flange 5.

The heater 50 is disposed to be divided while avoiding the gas introduction ports 51a to 51d. The heater 50 includes six heater elements 50a, 50b, 50c, 50d, 50e, and 50f, in which each of the heater elements 50a to 50f has an arc-shaped cross section. That is, the heater elements 50a to 50f are each disposed by dividing the entire circumference of the inlet flange into a plurality of parts along the outer peripheral surface of the inlet flange 5 while avoiding the gas introduction ports 51a, 51b, and 51c or the like such as pipes. As each of the heater elements 50a to 50f, for example, an arc-shaped metal block embedded with a cartridge heater may be used. In addition, in the present embodiments, the heater elements 50c and 50d are disposed so as to sandwich the gas introduction ports 51a to 51c, and are grouped.

Furthermore, the heater elements 50a and 50f are arranged on both sides of the exhaust port 26 and are grouped.

The heater elements 50c and 50d are disposed so as to sandwich the gas introduction ports 51a to 51c, and are grouped. Furthermore, the heater elements 50a and 50f are disposed on both sides of the exhaust port 26 and are grouped. Also, the heater elements 50b and 50e are disposed at positions separated from both of the gas introduction ports 51a to 51c and the exhaust port 26, and are grouped. In addition, the gas introduction port 51d corresponding to the nozzle 63c is disposed between the heater elements 50a and 50b which are relatively widely separated.

Furthermore, a temperature sensor 52a is installed on the outer peripheral surface of the inlet flange 5 near the heater element 50a, which is the exhaust port side in which the exhaust pipe 32 is disposed at its upper side. In addition, a temperature sensor 52b is installed on the outer peripheral surface of the inlet flange 5 near the heater element 50d, which is the gas introduction ports 51a to 51c side. Also, a temperature sensor 52c is installed on the outer peripheral surface of the inlet flange 5 near the heater element 50b.

These temperature sensors 52a to 52c are used to control the temperatures of the heaters 50 classified into three groups for each group depending on a distance from the exhaust port.

Figure 4:
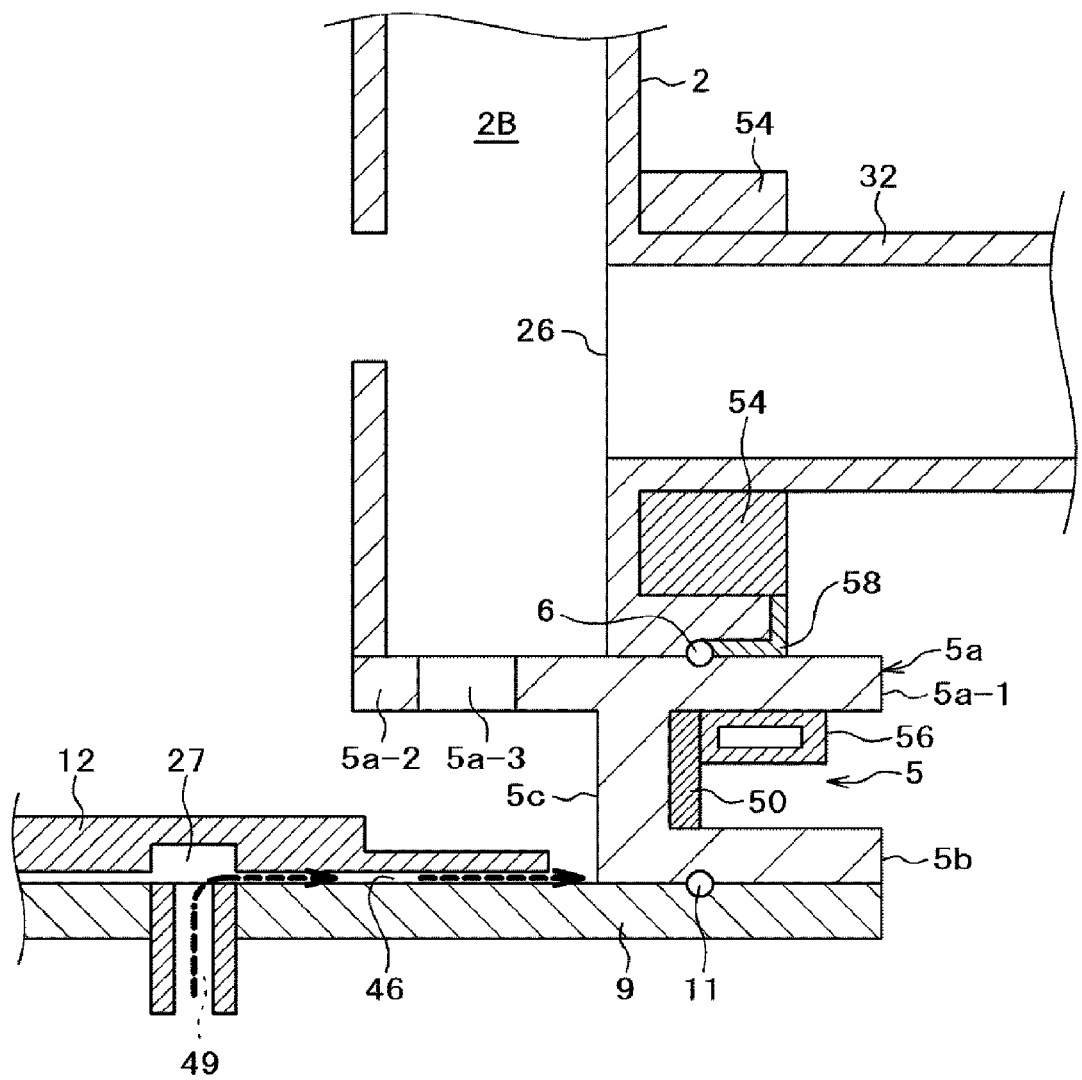
FIG. 4 is a vertical cross sectional view illustrating the periphery of the inlet flange.

As illustrated in FIG. 4, a padding portion 54 is formed at the base of the exhaust port 26 connected to the exhaust pipe 32 to facilitate the connection with the reaction tube 2 and to enhance the strength. The lower end of the padding portion 54 is continuously connected to the flange portion 2C of the reaction tube 2 directly below the exhaust pipe 32, to be integrated. Therefore, the fastener 5d cannot be installed at this position, and sufficient cooling cannot be performed by a cooling water passage 25.

That is, in the present embodiments, a cooling block 56 configured to allow cooling water to flow is installed below the padding portion 54 and on the lower surface of the lower flange 5b. Then, the entire circumference of the flange portion 2C can be cooled in cooperation with the cooling water passage 25 of the fastener 5d described above, so as to be maintained at a more uniform temperature. Furthermore, the cooling block 56 is thermally well coupled with the inlet flange 5.

In addition, a hole 5a-3 which directly communicates the inside of the furnace opening with the exhaust buffer chamber 2B is formed at the inner flange 5a-2. The hole 5a-3 mainly acts to release the first and second purge gases to the exhaust buffer chamber 2B.

Figure 5:
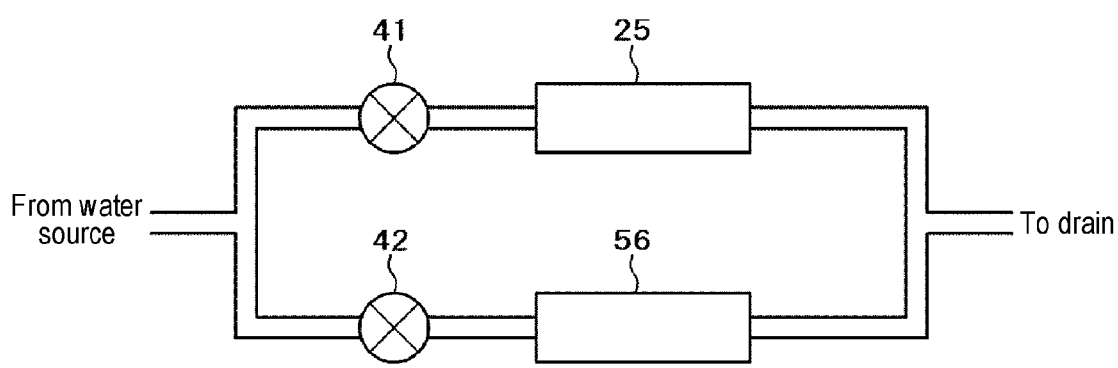
FIG. 5 is a diagram illustrating a supply system of cooling water to a furnace opening of the substrate processing apparatus.
Figure 6:
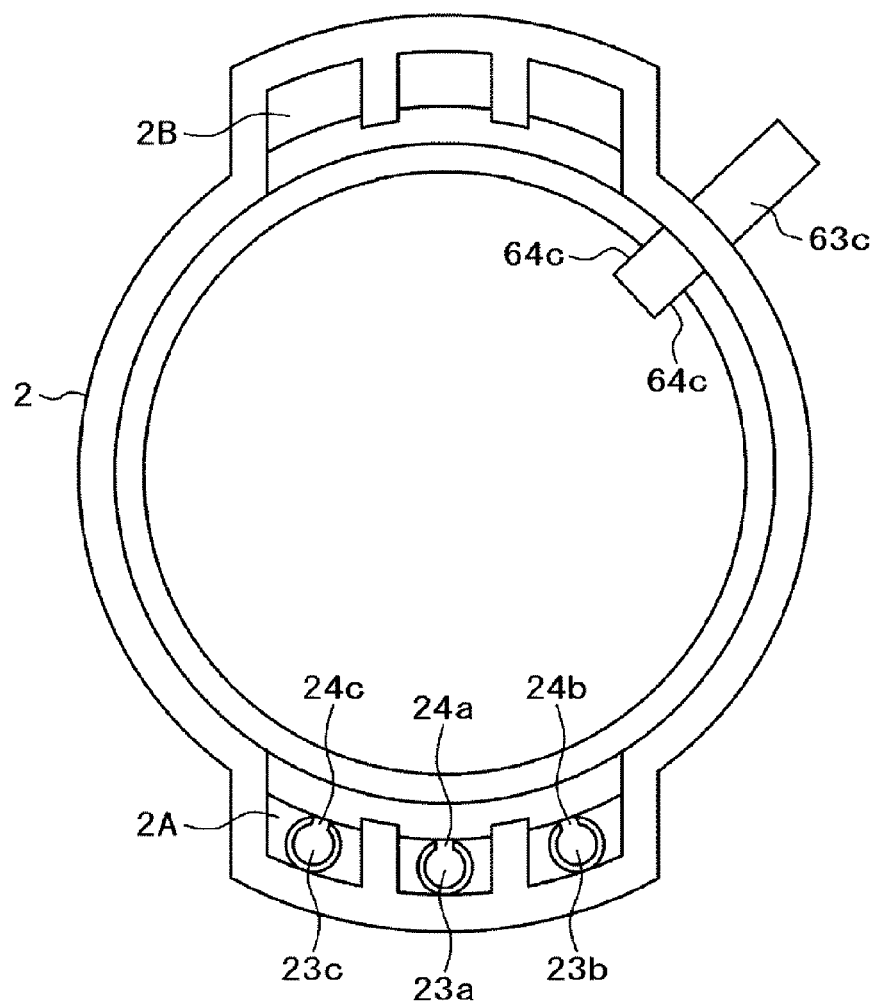
FIG. 6 is a cross sectional view illustrating an outline of the process furnace.

As illustrated in FIG. 5, a supply system for supplying cooling water to a cooler such as the cooling water passage 25 or the cooling block 56 as additional facility is installed at the substrate processing apparatus 1. City water or circulating cooling water cooled to a predetermined temperature as a water source is connected to the supply system. The valves 41 and 42 control the supply amount of cooling water to the cooling water passage 25 and the cooling block 56 according to a command from the controller 36 based on the recipe. Normally, it may be configured so that water having a substantially constant water pressure or flow rate is supplied to the supply system, and the valve 41 and the valve 42 are opened at a designated opening degree such that cooling water of a flow rate for keeping the seal member 6 at its heat resistant temperature or lower flows via the cooler.

When the inner surface of the inlet flange 5 is cooled to a room temperature or lower in a cleaning process as described hereinbelow, water cooled by a chiller can be allowed to flow via the cooling water passage 25 or the cooling block 56. In simple control, the temperature control (heating and cooling control) of the furnace opening is such that the heater 50 is heated to a constant temperature while allowing cooling water to always flow at the maximum flow rate. In a more eco-friendly method, cooling water is stopped and only heating is controlled at a set temperature or lower, and heating is stopped and only the amount of water (water temperature) is controlled at the set temperature or higher.

In the present embodiments, as illustrated in FIG. 4 described above, the heater 50 disposed on the outer peripheral surface of the inlet flange 5 is divided into the six heater elements 50a to 50f, and the heater elements 50a to 50f are grouped into three groups. Then, the temperature controller 60 independently controls electric power to be supplied to the heater elements 50a to 50f for each of the three groups based on the detection temperature detected by the temperature sensors 52a to 52c installed in the respective groups. By doing so, necessary heating can be performed at necessary positions and temperature non-uniformity of the furnace opening of the reaction tube 2 in the circumferential direction can be reduced. Thus, it becomes possible to positively heat a region hard to be heated.

Furthermore, it is possible to prevent adhesion of the byproduct by heating the entire circumferential direction to an appropriate temperature.

Next, a process (film-forming process) of forming a film on a wafer W using the aforementioned substrate processing apparatus 1 will be described. In the present disclosure, an example in which a silicon nitride (SiN) film is formed on the wafer W by supplying a DCS ($SiH_2Cl_2$:dichlorosilane) gas as a precursor gas and an $NH_3$ (ammonia) gas as a reaction gas to the wafer W will be described. In the following descriptions, the operations of the respective parts constituting the substrate processing apparatus 1 are controlled by the controller 36.

(Wafer Charging and Boat Loading)

If a plurality of wafers W is charged on the boat 14 (wafer charging), the boat 14 is loaded into the process chamber 8 by the boat elevator 17 (boat loading), and the lower portion of the reaction tube 2 and thereafter is hermetically sealed by the lid portion 9. At this time, a $N_2$ gas is supplied as the first purge gas 28 from the first purge gas supply part to the base portions of the nozzles 23a to 23c via the gap 45. Furthermore, a $N_2$ gas is supplied as the second purge gas 49 from the second purge gas supply part to the gap 46 via the second purge gas flow path 27. The supply of the first purge gas 28 and the second purge gas 49 may be continuously performed at least until the film-forming process is completed.

(Pressure Regulation and Temperature Adjustment)

The interior of the process chamber 8 is vacuum-exhausted (depressurization-exhausted) by the vacuum pump 35 so as to reach a desired pressure (degree of vacuum). The internal pressure of the process chamber 8 is measured by the pressure sensor 33. The APC valve 34 is feedback-controlled based on the measured pressure information. Furthermore, the wafers W in the process chamber 8 are heated by the heater 3 to a desired temperature. In this operation, a degree of supplying electric power to the heater 3 is feedback-controlled based on the temperature information detected by the temperature detector 4 such that the process chamber 8 has a desired temperature distribution. In addition, the rotation of the boat 14 and the wafers W by the rotation mechanism 16 begins.

Furthermore, at this time, the inlet flange 5 is heated by each of the heater elements 50a to 50f to, for example, a set temperature of 200 degrees C. or higher and lower than 300 degrees C. In this operation, the degree of supplying electric power of the heater elements 50a to 50f of each group is feedback-controlled by the temperature controller 60 such that the heater elements disposed in the respective regions of the inlet flange 5 reach the set temperature. The set temperature may be, for example, set so that the partial pressure of the byproduct does not exceed a saturated vapor pressure at the set temperature. The byproduct is not limited to one but may include, silicon deposited on any surface other than the wafers W, in addition to ammonium chloride, chlorosilane polymer, and the like. Furthermore, the heating of each of the heater elements 50a to 50f may be continuously performed at least until the film-forming process is completed.

(Film-Forming Process)

[Precursor Gas Supply Step]

If the internal temperature of the process chamber 8 is stabilized at a preset processing temperature, a DCS gas is supplied to the wafer W in the process chamber 8. The DCS gas is controlled by the MFC 21a so as to have a desired flow rate, and is supplied into the process chamber 8 via the gas supply pipe 19a and the nozzle 23a. At this time, a $N_2$ gas is supplied from the first purge gas supply part and the second purge gas supply part to the furnace opening. Thus, the base portions and the peripheral portions of the nozzles 23a to 23c can be intensively purged with the first purge gas 28, and other portions can be purged with the second purge gas 49 to dilute the concentration of the precursor gas in the furnace opening.

[Precursor Gas Exhaust Step]

Next, the supply of the DCS gas is stopped and the interior of the process chamber 8 is vacuum-exhausted by the vacuum pump 35. At this time, a $N_2$ gas as an inert gas may be supplied from the inert gas supply part into the process chamber 8 (inert gas purge). At this exhaust step, the APC valve 34 may be temporarily completely opened to allow a high-temperature exhaust gas to flow via the exhaust port 26 at a large flow rate so as to heat the same.

[Reaction Gas Supply Step]

Next, an $NH_3$ gas is supplied to the wafer W in the process chamber 8. The $NH_3$ gas is controlled by the MFC 21b so as to have a desired flow rate, and is supplied into the process chamber 8 via the gas supply pipe 19b and the nozzle 23b. At this time, a $N_2$ gas is supplied from the first purge gas supply part and the second purge gas supply part to the furnace opening.

[Reaction Gas Exhaust Step]

Next, the supply of the $NH_3$ gas is stopped and the interior of the process chamber 8 is vacuum-exhausted by the vacuum pump 35. At this time, a $N_2$ gas may be supplied from the inert gas supply part into the process chamber 8 (inert gas purge). Furthermore, the cooling water and the set temperature can be controlled in the same manner as at the precursor gas exhaust step.

A SiN film having a predetermined composition and a predetermined film thickness can be formed on the wafer W by implementing a cycle which performs four steps described above a predetermined number of times (once or more).

(Boat Unloading and Wafer Discharging)

After the film having the predetermined film thickness is formed, a $N_2$ gas is supplied from the inert gas supply part, and the interior of the process chamber 8 is substituted by a $N_2$ gas and the pressure of the process chamber 8 is returned to an atmospheric pressure. Thereafter, the lid portion 9 is lowered by the boat elevator 17 and the boat 14 is unloaded from the reaction tube 2 (boat unloading). Then, the processed wafers W are discharged from the boat 14 (wafer discharging).

The processing conditions for forming the SiN film on the wafer W may be, for example, exemplified as follows:

Processing temperature (wafer temperature): 300 to 700 degrees C.

Processing pressure (internal pressure of process chamber): 1 to 4,000 Pa

DCS gas flow rate: 100 to 10,000 sccm

NH3 gas flow rate: 100 to 10,000 sccm

N2 gas flow rate: 100 to 10,000 sccm.

By setting the respective processing conditions to a value within each range, the film-forming process can properly go ahead. The film-forming process is not limited to forming the SiN film on the wafer W but may be appropriately applied to, e.g., a case where a $SiO_2$ film, a SiON film, or the like is formed on the wafer W.

[Cleaning Process]

Next, cleaning of the interior of the process chamber 8 is performed. During the process of forming the SiN film, deposits or byproduct (deposited film) may be formed on the inner walls of the reaction tube 2 and the inlet flange 5, the surface of the boat 14, or the like. This deposited film is accumulated by repeatedly performing the batch process described above, and gradually becomes thicker. This accumulated deposited film becomes a factor of foreign substances due to delamination and adhesion to the wafer W in a subsequent process. Therefore, in preparation for the subsequent process, the deposited film is removed from the interior of the process chamber 8 when the thickness of the deposited film reaches a predetermined thickness. The properties (the composition, the film thickness, and the like) of deposits or the like are different in the nozzles, in the furnace (reaction tube 2) and in the furnace opening (inlet flange 5), and generally, a lot of deposits tend to be adhered to the interior of the nozzle 23a for the precursor gas and the low-temperature portion of the furnace opening side. Furthermore, in a low-temperature region (a region not surrounded by the heater 3 and a region other than a region which horizontally surrounds a wafer arrangement region) in the process chamber 8, deposits or the like are more likely to be adhered, than in a high-temperature region (a region surrounded by the heater 3 and the region which horizontally surrounds the wafer arrangement region).

Figure 7:
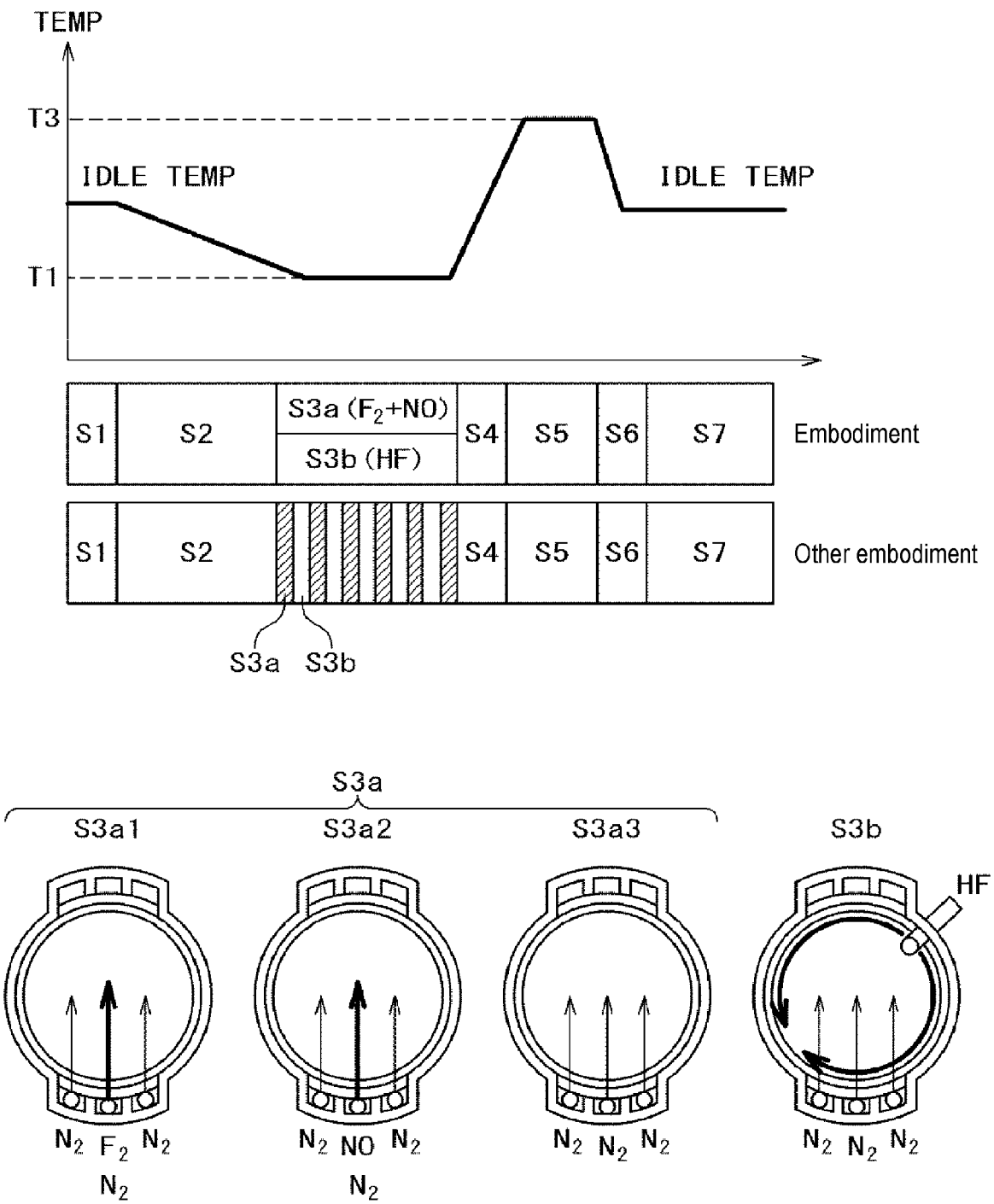
FIG. 7 is a diagram illustrating a cleaning process.

A fluorine ($F_2$) gas and a nitrogen monoxide (NO) gas are supplied as a first cleaning gas into the nozzles and the furnace, and a hydrogen fluoride (HF) gas is supplied as a second cleaning gas into the furnace opening. That is, cleaning is performed by each gas in a situation where the first cleaning gas and the second cleaning gas can coexist in the process vessel 7. At this time, since the higher temperature causes less damage to the reaction tube by the HF gas, the reaction tube temperature rises, whereas the furnace opening temperature drops to increase the etching rate of the HF gas. As the first cleaning gas, it may be possible to use, in addition to the $F_2$ gas, a fluorine-containing gas such as $NF_3$, $ClF_3$, or the like. Furthermore, as the second cleaning gas, it may be possible to use, in addition to the NO gas, a gas containing a nitrogen element and an oxygen element, such as a nitrous oxide ($N_2O$) gas, a nitrogen dioxide ($NO_2$) gas, or the like. It is desirable that the $F_2$ gas and the NO gas be used. As illustrated in FIG. 7, the cleaning process may be performed in the following procedure.

(Boat Loading: S1)

The boat 14 with no wafer W loaded (empty boat 14) is loaded into the process chamber 8 according to the same procedures as those of the aforementioned boat loading.

(Pressure Regulation and Temperature Adjustment: S2)

The interior of the process chamber 8 is vacuum-exhausted by the vacuum pump 35 so as to reach a desired pressure (degree of vacuum). At this time, the internal pressure of the process chamber 8 is measured by the pressure sensor 33. The APC valve 34 is feedback-controlled based on the measured pressure information (pressure regulation). The driving of the vacuum pump 35 may be continuously performed at least until the purge of the cleaning gas remaining in the process chamber 8 (S5) is completed. At this time, a $N_2$ gas is supplied as the first purge gas 28 from the gas supply pipe 19f. Furthermore, a $N_2$ gas is supplied as the second purge gas 49 from the gas supply pipe 19f. The supply of the first purge gas 28 and the second purge gas 49 may be continuously performed at least until the cleaning process is completed. The flow rates of the first purge gas 28 and the second purge gas 49 may be increased, especially while the first cleaning gas and the second cleaning gas are being supplied, compared with the flow rates during the film-forming process. It is desirable that the total flow rate of the first purge gas 28 and the second purge gas 49 be set larger than the total flow rate of the first cleaning gas and the second cleaning gas.

The degree of supplying electric power to the heater 3 is controlled so that the interior of the process chamber 8 reaches a predetermined first temperature T1, so as to allow the internal temperature of the process chamber 8 to drop. At this time, the degree of supplying electric power to the heater 3 and the cooling of a cooling mechanism (not shown) of the heater 3 can be feedback-controlled based on temperature information detected by a plurality of temperature detectors 4 in the furnace so that the interior of the process chamber 8 has a desired temperature distribution (temperature adjustment). The first temperature T1 falls within a range of, for example, 200 to 400 degrees C. Furthermore, the temperature is controlled by heating by the heater 50 and cooling by the cooling water passage 25 and the cooling block 56 such that the furnace opening reaches a predetermined second temperature (T2). The second temperature T2, which is lower than the first temperature T1, falls within a range of, for example, 5 to 75 degrees C. At this time, the degree of supplying electric power to the heater 50 and the opening/closing operation of the valves 41 and 42 are feedback-controlled based on the temperature information detected by the temperature sensors 52a, 52b, and 52c so that the furnace opening has a predetermined temperature distribution (temperature adjustment). The temperature control of the interior of the process chamber 8 by the heater 3 and the temperature control of the furnace opening by the heater 50, the cooling water passage 25, and the cooling block 56 may be continuously performed at least until the cleaning of the interior of the process chamber 8 is completed. The first temperature range and the second temperature range are separated at least by 100 degrees C. or higher at temperature measurement points, which do not overlap.

Then, the boat 14 is rotated by the rotation mechanism 16. The rotation of the boat 14 by the rotation mechanism 16 may be continuously performed at least until the cleaning of the interior of the process chamber 8 is completed. Also, the boat 14 may not be rotated.

(Cleaning Gas Supply: S3)

Next, a $F_2$ gas and a NO gas are supplied as the first cleaning gases from the nozzle 23a which is the first nozzle, and a HF gas is supplied as the second cleaning gas from the nozzle 63c which is the second nozzle.

Since the nozzle 23a is used to supply the precursor gas formed on the wafer W, the gas is supplied to near the wafer W accommodated in the process chamber 8. Therefore, the nozzle 23a is more likely to supply the gas to the reaction tube 2 side, which is a portion (upper side in FIG. 1) that accommodates the wafer W in the process chamber 8, than the inlet flange 5 side. Thus, when the gas is supplied from the nozzle 23a, the reaction tube 2 side is more likely to be cleaned than the inlet flange 5 side.

On the other hand, the nozzle 63c supplies the gas to the inlet flange 5 side, in comparison with the nozzle 23a. Therefore, the nozzle 63c is more likely to supply the gas to the inlet flange 5 side, for example, to the inner wall surface of the inlet flange 5, than to the reaction tube 2 side. Thus, when the gas is supplied from the nozzle 63c, the inlet flange 5 side is more likely to be cleaned than the reaction tube 2 side.

At this time, by setting the temperature of an object to be cleaned with each etching gas at a temperature at which it can be effectively cleaned, it is possible to reliably clean the object while preventing damage to that other than the object to be cleaned.

The cleaning gas supply step S3 will be more specifically described.

At step S3a1, the valve 62a of the gas supply pipe 60a is opened to allow an $F_2$ gas to flow through the gas supply pipe 60a. The flow rate of the $F_2$ gas flowing from the gas supply pipe 60a is adjusted by the MFC 61a. The flow rate-adjusted $F_2$ gas is supplied into the process chamber 8 from the supply hole 24a of the nozzle 23a, is brought into contact with the surfaces or the like of the reaction tube 2 and the boat 14, and is exhausted from the exhaust pipe 32. At this time, the valve 22c of the gas supply pipe 19c is opened to supply a $N_2$ gas as an inert gas, which is adjusted in the flow rate by the MFC 21c, from the nozzle 23a. At this time, in order to prevent entering of the $F_2$ gas into the nozzles 23b and 23c, the valves 22d and 22e of the gas supply pipes 19d and 19e are opened to supply a $N_2$ gas as an inert gas from the nozzles 23b and 23c.

After the lapse of a predetermined time, for example, 30 seconds, at step S3a2, the valve 62a of the gas supply pipe 60a is closed, and thereafter, the valve 62b of the gas supply pipe 60b is opened to allow a NO gas to flow through the gas supply pipe 60b. The flow rate of the NO gas flowing from the gas supply pipe 60b is adjusted by the MFC 61b. The flow rate-adjusted NO gas is mixed with the $F_2$ gas remaining in the nozzle 23a to exert a strong etching action, thereby cleaning the inside of the nozzle 23a. The gas is supplied into the process chamber 8 from the supply hole 24a of the nozzle 23a, is sequentially brought into contact with the surfaces or the like of the supply buffer chamber 2A, the reaction tube 2, the boat 14, and the exhaust buffer chamber 2B to be cleaned, and is then exhausted from the exhaust pipe 32. At this time, the valve 22c of the gas supply pipe 19c is opened to supply a $N_2$ gas as an inert gas, which is adjusted in the flow rate by the MFC 21c, from the nozzle 23a. Furthermore, in order to prevent entering of the NO gas into the nozzles 23b and 23c, the valves 22d and 22e of the gas supply pipes 19d and 19e are opened to supply a $N_2$ gas as an inert gas from the nozzles 23b and 23c.

After the lapse of a predetermined time, for example, 30 seconds, at step S3a3, the valve 62b of the gas supply pipe 60b is closed. At this time, the valves 22c, 22d, and 22e of the gas supply pipes 19c, 19d, and 19e are opened to supply an $N_2$ gas as an inert gas, which is adjusted in the flow rate by the MFCs 21c, 21d, and 21e, from the nozzles 23a, 23b, and 23c. Step S3a3 is not essential. In addition, a step of exhausting the N₂ gas to near the reaching pressure of the vacuum pump 35 by sufficiently reducing the flow rate of the N₂ gas may be performed after step S3a3 or instead of step S3a3.

Steps S3a1 to S3a3 are repeated a predetermined number of times. Also, step S3a1 and step S3a2 may be simultaneously performed (i.e., the gases are mixed in the gas supply pipe 60a), and step S3a3 may be omitted. In this case, continuous supply may be performed instead of repetition.

At step S3b, in parallel with steps S3a1 to S3a3 which are repeated the predetermined number of times, the valve 62c of the gas supply pipe 60c is opened to allow a HF gas to flow through the gas supply pipe 60c. At this time, the valve 62d of the gas supply pipe 60d is closed. The flow rate of the HF gas flowing from the gas supply pipe 60c is adjusted by the MFC 61c. The flow rate-adjusted HF gas is supplied into the process chamber 8 from the gas supply hole 64c of the nozzle 63c, is brought into contact with the inner wall or the like of the inlet flange 5, and is exhausted from the exhaust pipe 32. The valve 62c of the gas supply pipe 60c may be closed while step S3a3 or the exhaust step is performed.

The cleaning is selectively performed mainly on a relatively high-temperature region such as the inner wall of the nozzle 23a or the reaction tube 2 or the surface of the boat 14 by a mixture gas of F₂ and NO supplied from the nozzle 23a (high-temperature portion cleaning). The cleaning is selectively performed mainly on a relatively low-temperature region such as the inner wall of the inlet flange 5, or the upper surfaces of the lid portion 9 and the protection plate 12 by the HF gas supplied from the nozzle 63c (low-temperature portion cleaning).

During the cleaning, the internal pressure of the process chamber 8 is set at a pressure which falls within a range of, for example, 77 Pa to 53.2 kPa, by adjusting the APC valve 34. The supply flow rate of the HF gas controlled by the MFC 61c is set at a flow rate which falls within a range of, for example, 0.1 to 4 slm. The supply flow rates of the F₂ gas and the NO gas controlled by the MFCs 61a and 61b are set at a flow rate which falls within a range of, for example, 0.1 to 4 slm. The supply flow rate of the N₂ gas controlled by the MFC 21c is set at a flow rate which falls within a range of, for example, 0.2 to 10 slm. In the present disclosure, it is desirable that the flow rate ratio between the HF gas and the F₂ gas be set to 1:4 or more or 4 or more:1. The flow rate ratio of 1:4 or more means that the F₂ gas flows 4 times or more than the HF gas, and the flow rate ratio of 4 or more:1 means that the HF gas flows 4 times or more than the F₂ gas.

Figure 8:
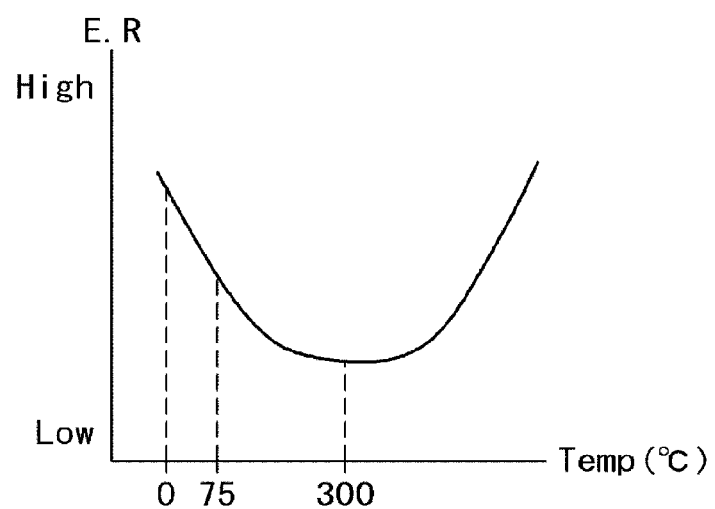
FIG. 8 is a diagram illustrating a relationship between an etching rate and a temperature of a HF gas.

As illustrated in FIG. 8, at a temperature of 300 degrees C. or lower, the lower the temperature, the higher the etching rate (E.R) of the HF gas, due to the coexistence of moisture and the proximity (wetness) of the HF gas to the saturated vapor pressure. In addition, in the etching rate of the F₂ gas and the NO gas, the etching rate is minimized around 75 to 50 degrees C. due to the rate of reaction generating atomic fluorine from F₂ and NO, and is increased as the temperature rises in the range of 75 to 400 degrees C. Therefore, in order to maximize selectivity, it is desirable that the first temperature in the process chamber 8 be 200 degrees C. or higher and that the second temperature in the inlet flange 5 be 75 degrees C. or lower. On the other hand, if the second temperature exceeds 75 degrees C., the F₂ gas or the like diffused into the inlet flange 5 may cause the inlet flange 5 to be excessively etched to shorten its life. Furthermore, if the first temperature falls below 200 degrees C., the HF gas diffused into the reaction tube 2 may cause damage to the reaction tube 2. If the first temperature exceeds 400 degrees C., the etching by the F₂ gas or the like may become excessive or non-uniform.

Figure 9:
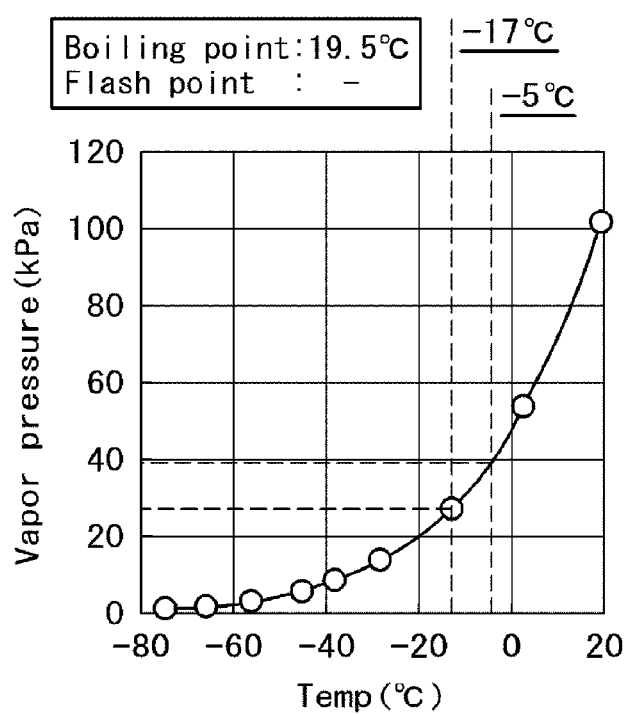
FIG. 9 is a diagram illustrating a relationship between a vapor pressure and a temperature of HF.

As illustrated in FIG. 9, in a vapor pressure curve of HF, the boiling point at an atmospheric pressure (100 kPa) is 19.5 degrees C., and HF is a gas at a room temperature. At 53.2 kPa (400 Torr) or lower, the boiling point is 5 degrees C. or lower. For example, if the vapor pressure is 39.9 kPa (300 Torr), the temperature is −5 degrees C., and if the vapor pressure is 26.6 kPa (200 Torr), the temperature is −17 degrees C. If the internal pressure of the process chamber 8 during the cleaning is 53.2 kPa or lower, the HF gas does not liquefy even if the internal temperature of the inlet flange 5 is 5 degrees C., and there is no problem of liquefaction corrosion or the like. Therefore, it is desirable that the second temperature in the inlet flange 5 be 5 degrees C. or higher. On the other hand, if the second temperature in the inlet flange 5 is lower than 5 degrees C., there is a risk of corrosion due to liquefied HF.

(Pressure Regulation and Temperature Adjustment: S4)

The interior of the process chamber 8 is vacuum-exhausted by the vacuum pump 35 so as to reach a desired pressure (degree of vacuum) which is higher in vacuum than when supplying the cleaning gas at step S3, and the heating of the heater 3 is controlled so that the interior of the process chamber 8 reaches a predetermined third temperature T3. At this time, the internal pressure of the process chamber 8 is measured by the pressure sensor 33. The APC valve 34 is feedback-controlled based on the measured pressure information (pressure regulation). Furthermore, the furnace opening is cooled so that the seal member 6 is kept at a temperature equal to or lower than its heat resistant temperature (for example, 300 degrees C.).

(Purge and Atmospheric Pressure Return: S5 and Leak Check: S6)

After the interior of the process chamber 8 reaches the predetermined third temperature (for example, 750 degrees C.), the valves 22c, 22d, 22e, 22f, 22g, and 62d are opened, and a N₂ gas as an inert gas is supplied from each of the gas supply pipes 19c, 19d, 19e, 19f, 19g and 60d into the process chamber 8, and is exhausted from the exhaust pipe 32. The N₂ gas acts as a purge gas. The interior of the process chamber 8 is purged with an inert gas and the gas remaining within the process chamber 8 is removed from the interior of the process chamber 8 (purge). Thereafter, the heating of the heater 3 is controlled so that the interior of the process chamber 8 reaches a standby temperature. Furthermore, the APC valve 34 is closed, the interior of the process chamber 8 is filled with an inert gas, and the internal pressure of the process chamber 8 is returned to an atmospheric pressure (atmospheric pressure return). At this time, the supply of all the inert gases is temporarily stopped and leak check is performed.

(Boat Unloading: S7)

The boat 14 is unloaded to the outside of the reaction tube 2 according to the same procedures as those of the aforementioned boat unloading. Then, the lower end opening of the inlet flange 5 is sealed by a shutter (not shown).

Other Embodiments

After the fluorine (F₂) gas and the nitrogen monoxide (NO) gas are supplied as the first cleaning gas from the nozzle 23a as the cleaning gas supply at the cleaning gas supply step (S3), a hydrogen fluoride (HF) gas is supplied as the second cleaning gas from the nozzle 63c, and this may be repeated a plurality of times to supply the cleaning gases.

The cleaning gas supply step (S3) according to other embodiments will be more specifically described.

In step S3a of supplying the $F_2$ gas and the NO gas, steps S3a1 to S3a3 are respectively performed once. Steps S3a1 to S3a3 are similar to those of the embodiments. However, the valve 62d of the gas supply pipe 60d is opened to supply a $N_2$ gas as an inert gas, which is adjusted in the flow rate by the MFC 61d, from the nozzle 63c.

After step S3a3, at step S3b, the valve 62c of the gas supply pipe 60c is opened to allow a HF gas to flow through the gas supply pipe 60c. The flow rate of the HF gas flowing from the gas supply pipe 60c is adjusted by the MFC 61c. The flow rate-adjusted HF gas is supplied into the process chamber 8 from the gas supply hole 64c of the nozzle 63c, is brought into contact with the inner wall or the like of the inlet flange 5, and is exhausted from the exhaust pipe 32. At this time, the valve 62d of the gas supply pipe 60d is closed. Furthermore, the valves 22c, 22d, and 22e of the gas supply pipes 19c, 19d, and 19e are opened to supply a $N_2$ gas as an inert gas, which is adjusted in the flow rate by the MFCs 21c, 21d, and 21e, from the nozzles 23a, 23b, and 23c.

Steps Sa (steps S3a1 to S3a3) and step Sb are repeated a predetermined number of times. During this time, the internal temperature of the reaction tube 2 (on the center side of the reaction vessel 7) is kept at 200 to 400 degrees C., and the internal temperature of the inlet flange 5 is kept at 5 to 75 degrees C. Although the first cleaning gas and the second cleaning gas are supplied in a time-division manner, since the other gas is supplied before one gas is sufficiently exhausted, they are mixed in the process vessel 7 and coexist.

COMPARATIVE EXAMPLE

A technique (comparative example) studied by the present discloser prior to the present disclosure will be described with reference to FIG. 10. The furnace opening of the comparative example includes no temperature control mechanism. Therefore, after the internal temperature of the process chamber 8 is set low and cleaning is performed with a HF gas, the internal temperature of the process chamber 8 is set high and cleaning is performed with a $F_2$ gas and a NO gas.

(Boat Loading: S1)

This step is similar to S1 of the embodiments. The boat 14 with no wafer W charged (empty boat 14) is loaded into the process chamber 8 according to the same procedures as those of the aforementioned boat loading.

(Pressure Regulation and Temperature Adjustment: S2a)

The interior of the process chamber 8 is vacuum-exhausted by the vacuum pump 35 so as to reach a predetermined pressure (degree of vacuum), as in the embodiments.

The temperature drops by the cooling mechanism (not shown) of the heater 3 so that the interior of the process chamber 8 reaches a predetermined fourth temperature T4, as in the embodiments. However, the fourth temperature T4 is lower than the first temperature (T1), and thus it takes longer time than the embodiments to lower the temperature.

Then, the boat 14 is rotated by the rotation mechanism 16. The rotation of the boat 14 by the rotation mechanism 16 may be continuously performed at least until the cleaning of the interior of the process chamber 8 is completed. Also, the boat 14 may not be rotated.

(Cleaning Gas Supply: S3b)

Next, a cleaning gas is supplied into the process chamber 8. A HF gas is supplied as the cleaning gas from the nozzle 63c.

At step S3b, a HF gas is supplied 8 into the process chamber 8 from the gas supply hole 64c of the nozzle 63c, is brought into contact with the inner wall or the like of the inlet flange 5, and is exhausted from the exhaust pipe 32, as in the embodiments. However, the valves 22c, 22d, and 22e of the gas supply pipes 19c, 19d, and 19e are opened to supply a $N_2$ gas as an inert gas, which is adjusted in the flow rate by the MFCs 21c, 21d, and 21e, from the nozzles 23a, 23b, and 23c.

During the cleaning, the internal pressure of the process chamber 8 is set at a pressure which falls within a range of, for example, 133 Pa (1 Torr) to 53,200 Pa (400 Torr), by adjusting the APC valve 34. The supply flow rate of the HF gas controlled by the MFC 61c is set at a flow rate which falls within a range of, for example, 100 sccm (0.1 slm) to 4,000 sccm (4 slm). The temperature of the heater 3 is set such that the fourth temperature T4 in the process chamber 8 becomes a temperature which falls within a range of, for example, 75 degrees C. or higher and lower than 100 degrees C.

(Pressure Regulation: S4a and Temperature Adjustment: S4b)

The interior of the process chamber 8 is vacuum-exhausted by the vacuum pump 35, as at step S4 of the embodiments, so as to reach a desired pressure (degree of vacuum) which is higher in vacuum than when supplying the cleaning gas at step S3. The interior of the process chamber 8 is heated by the heater 3, as at step S4 of the embodiments, so as to reach the predetermined third temperature T3. Since the fourth temperature T4 is lower than the first temperature T1 of the embodiments, it takes longer time than the embodiments to heat it up to the third temperature T3.

(Purge: S5a and Leak Check: S6)

After the interior of the process chamber 8 reaches the predetermined third temperature, the valves 22c, 22d, 22e, 22f, 22g, and 62d are opened to supply a $N_2$ gas as an inert gas from each of the gas supply pipes 19c, 19d, 19e, 19f, 19g, and 60d into the process chamber 8, and is exhausted from the exhaust pipe 32. The $N_2$ gas acts as a purge gas. The interior of the process chamber 8 is purged with an inert gas and the gas remaining within the process chamber 8 is removed from the interior of the process chamber 8 (purge). Thereafter, the temperature drops by the cooling mechanism (not shown) of the heater 3, as in the embodiments, so that the interior of the process chamber 8 reaches the predetermined first temperature T1, and leak check is performed (step S6).

(Cleaning Gas Supply: S3a)

Step S3a (steps S3a1 to S3a3) of supplying a $F_2$ gas and a NO gas is similar to that of the embodiments. However, the valve 62d of the gas supply pipe 60d is opened to supply a $N_2$ gas as an inert gas, which is adjusted in the flow rate by the MFC 61d, from the nozzle 63c.

The pressure regulation and temperature adjustment (step S4), the purge and the atmospheric pressure return (step S5), and the boat unloading (step S7) are similar to those of the embodiments.

Figure 10:
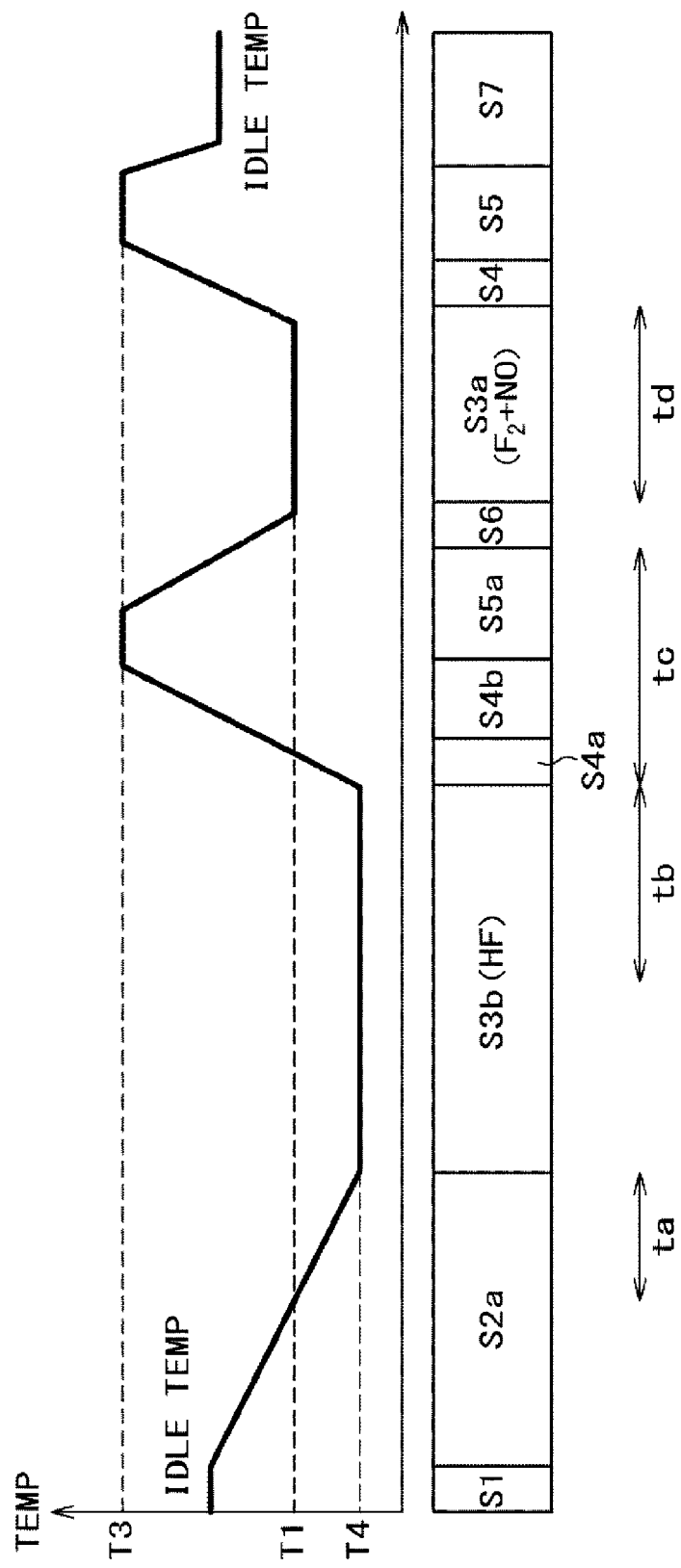
FIG. 10 is a diagram illustrating a cleaning process according to a comparative example.

In the embodiments, since the cleaning is performed in a state in which the internal temperature of the process chamber 8 is higher than that in the comparative example, it is possible to shorten the temperature-dropping time in the process chamber 8 and to eliminate time to illustrated in FIG. 10. Furthermore, since the cleaning with the HF gas is performed at a temperature lower than that of the comparative example, it is possible to improve the etching rate and to eliminate time tb illustrated in FIG. 10. In addition, the embodiments can more reduce the number of times of temperature changes than the comparative example. Moreover, since the cleaning with the HF gas and the cleaning with the $F_2$ gas and the NO gas are performed in parallel, it is possible to eliminate times tc and td illustrated in FIG. 10. Thus, in the embodiments, it is possible to reduce the cleaning time to half or less, compared with the comparative example.

According to the embodiments, at least one effect as set forth below may be achieved.

(1) Since the gas supply mechanism supplies two different kinds of cleaning gases, it is possible to perform cleaning by supplying the cleaning gases having different characteristics.

(2) Since the gas supply mechanism supplies the cleaning gases from two different locations, it is possible to supply two kinds of cleaning gases in parallel.

(3) Since the heater and the cooler set the temperature of the inner surface of the reaction vessel differently between the center side (the region surrounded by the heater 3) and the opening side, it is possible to supply the cleaning gases having different characteristics in parallel.

(4) By setting the first temperature range higher than a minimum point of the etching rate of the first cleaning gas and setting the second temperature range lower than a maximum point of the etching rate of the second cleaning gas, it is possible to perform respective etchings with high locality. Simultaneously, by setting the second temperature range higher than the condensation point of the second cleaning gas (hydrogen fluoride), it is possible to prevent the corrosion of the reaction vessel.

(5) The supply time and the supply amount of the $F_2$ gas and the NO gas, and the distribution of the first temperature in the process chamber can be used as parameters in order to reduce the non-uniformity of etching in the nozzles or in the reaction tube.

MODIFICATION EXAMPLES

While one or more embodiments of the present disclosure have been specifically described above, the present disclosure is not limited to the aforementioned embodiments but may be variously modified without departing from the spirit of the present disclosure.

In the embodiments, the nozzles use an I-shape extending from the lower side to the upper side, but as illustrated in FIGS. 11A to 11C and 12A to 12C, it may be a U-shape folded back at the upper side of the reaction tube.

As illustrated in FIGS. 11A to 11C and 12A to 12C, in the modification examples, nozzles 23*d* and 23*e* for supplying an inert gas such as a $N_2$ gas or the like are included, in addition to the nozzles 23*a*, 23*b*, and 23*c* of the embodiments.

Figure 11A:
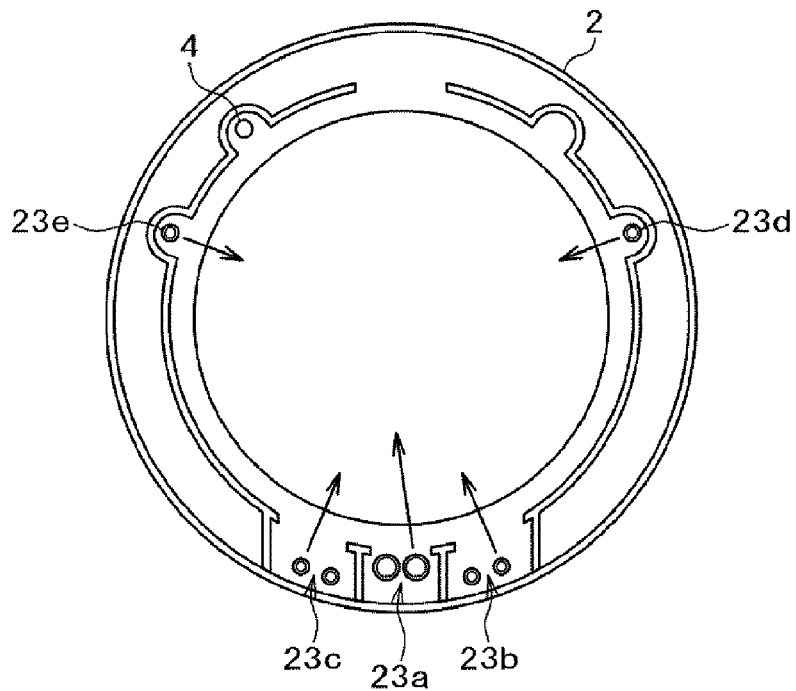
FIG. 11A is a cross sectional view illustrating an outline of a process furnace in a first modification example and a second modification example.
Figures 11B, 11C:
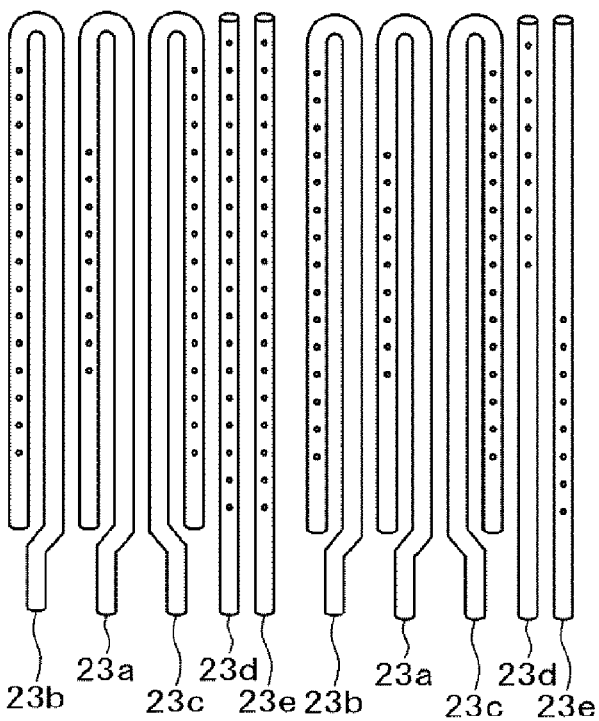
FIG. 11B is a front view of nozzles in the first modification example.
FIG. 11C is a front view of nozzles in the second modification example.

As illustrated in FIG. 11B, the nozzles 23*a*, 23*b*, and 23*c* of a first modification example are U-shaped folded back at the upper portion of the reaction tube, and include a plurality of supply holes at the folded leading end side. The nozzles 23*d* and 23*e* of the first modification example are I-shaped, whose diameter is smaller than the diameter of the nozzles 23*a*, 23*b*, and 23*c* and whose number of supply holes is larger than the number of supply holes of the nozzles 23*a*, 23*b*, and 23*c*.

As illustrated in FIG. 11C, the nozzles 23*a*, 23*b*, and 23*c* of a second modification example are similar to those of the first modification example. The nozzles 23*d* and 23*e* of the second modification example are I-shaped as in the first modification example, but the diameter thereof is equal to the diameter of the nozzles 23*a*, 23*b*, and 23*c*, and the number of supply holes thereof is smaller than the number of supply holes of the nozzles 23*d* and 23*e* of the first modification example. Furthermore, the supply hole of the nozzle 23*d* of the second modification example is arranged at the upper side which is the leading end side, and the supply hole of the nozzle 23*e* is arranged at the lower side which is the bottom side.

Figure 12A:
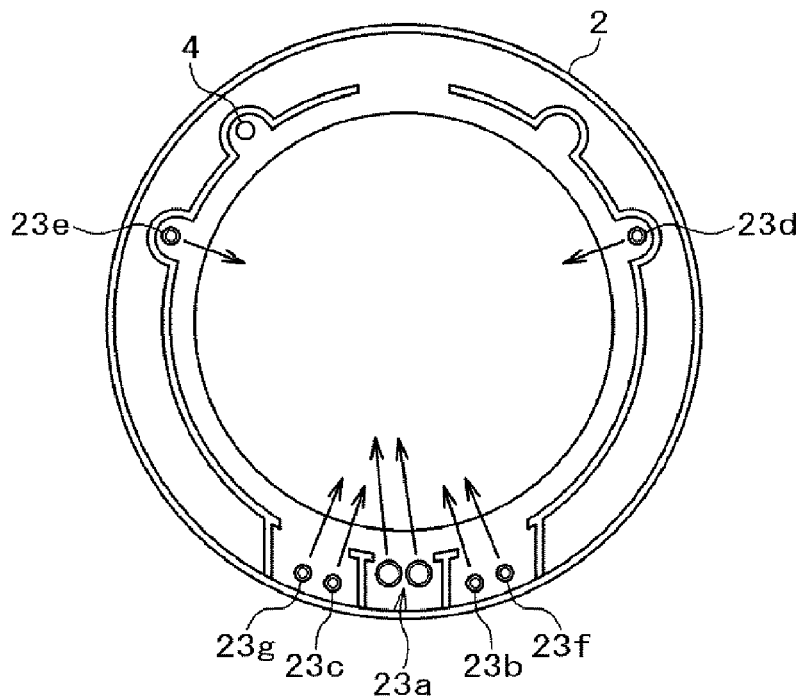
FIG. 12A is a cross sectional view illustrating an outline of a process furnace in a third modification example and a fourth modification example.
Figures 12B, 12C:
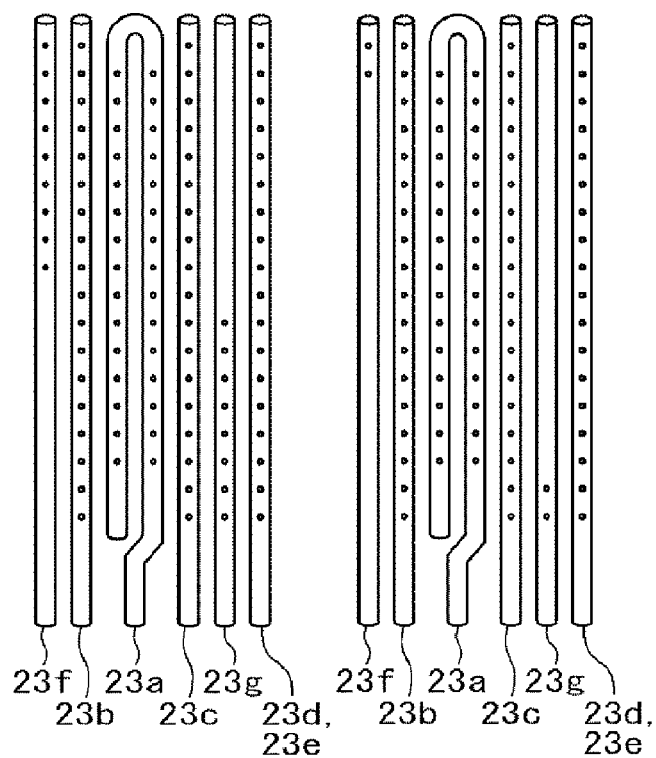
FIG. 12B is a front view of nozzles in the third modification example.
FIG. 12C is a front view of nozzles in the fourth modification example.

The nozzles 23*a*, 23*d*, and 23*e* of a third modification example illustrated in FIG. 12B are similar to those of the first modification example. The nozzles 23*b* and 23*c* of the third modification example are I-shaped, whose diameter is equal to the diameter of the nozzle 23*a*, and I-shaped nozzles 23*f* and 23*g* are included adjacent to each other. The diameters of the nozzles 23*f* and 23*g* of the third modification example are equal to the diameters of the nozzles 23*b* and 23*c* of the third modification example, and the number of supply holes thereof is smaller than the number of supply holes of the nozzles 23*b* and 23*c* of the third modification example. Furthermore, the supply hole of the nozzle 23*f* of the third modification example is arranged at the upper side which is the leading end side, and the supply hole of the nozzle 23*g* is arranged at the lower side which is the bottom side.

The nozzles 23*a*, 23*b*, and 23*c* of a fourth modification example illustrated in FIG. 12C are similar to those of the third modification example. The nozzles 23*d* and 23*e* of the fourth modification example are I-shaped similarly to the nozzles 23*d* and 23*e* of the third modification example, but the diameter thereof is larger than that of the nozzles 23*d* and 23*e* of the third modification example. The shapes and diameters of the nozzles 23*f* and 23*g* of the fourth modification example are similar to those of the nozzles 23*f* and 23*g* of the third modification example, but the number of supply holes thereof is smaller than the number of supply holes of the nozzles 23*f* and 23*g* of the third modification example. Furthermore, the supply hole of the nozzle 23*f* of the fourth modification example is arranged at the upper side which is the leading end side, as in the third modification example, and the supply hole of the nozzle 23*g* is arranged at the lower side which is the base side, as in the third modification example.

A cleaning method of a substrate processing apparatus includes: maintaining an entire circumference of an opening portion of a reaction vessel within a second temperature range lower than within a first temperature range in a state in which a temperature at a center portion of the reaction vessel falls within the first temperature range; supplying a first cleaning gas from near a region in which a substrate is arranged in the reaction vessel; supplying a second cleaning gas from near the opening portion in the reaction vessel; and substantially simultaneously performing cleaning of the center portion of the reaction vessel with the first cleaning gas and cleaning of the opening portion with the second cleaning gas in a state in which the supplied first cleaning gas and second cleaning gas coexist in the reaction vessel, wherein the first cleaning gas and the second cleaning gas are supplied by one of a method in which the first cleaning gas and the second cleaning gas are simultaneously supplied at a flow rate ratio of 1:4 or more, a method in which the first cleaning gas and the second cleaning gas are simultaneously supplied at a flow rate ratio of 4 or more:1, and a method in which the first cleaning gas and the second cleaning gas are alternately supplied.

According to the present disclosure in some embodiments, it is possible to improve efficiency of a cleaning process.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
a reaction vessel including a first region in which a substrate is arranged and a second region in which no substrate is arranged;
a gas supplier configured to supply a plurality of gases including cleaning gases that clean an interior of the reaction vessel;
a controller that controls the gas supplier to clean the first region and the second region in parallel under different conditions by a method in which the gas supplier supplies two different kinds of cleaning gases; and
a cooler configured to cool an opening portion of the reaction vessel,
wherein the reaction vessel includes:
a reaction tube made of a heat resistant and corrosion resistant material; and
an inlet flange including a port configured to connect an opening of the reaction tube to an opening of the reaction vessel and to introduce the cleaning gases into the reaction vessel,
wherein the cooler is installed so as to make contact with a substantially entire circumference of the opening of the reaction vessel, and the opening portion of the reaction vessel is cooled by allowing a cooling medium to flow through the cooler, and
wherein an inner surface of the inlet flange is maintained at 200 degrees C. or higher when processing the substrate.

2. The substrate processing apparatus according to claim 1, wherein the reaction vessel includes the reaction tube that is cylindrical and includes an opening, through which the substrate is capable of being taken in and out via the second region, at the first region,
wherein the first region and the second region are in fluid communication, and
wherein a heat-insulating structure is disposed at the second region while the substrate is arranged at the first region.

3. The substrate processing apparatus according to claim 1, wherein the gas supplier includes:
a first nozzle configured to supply a first cleaning gas to the first region; and
a second nozzle configured to supply a second cleaning gas to the second region.

4. The substrate processing apparatus according to claim 3, wherein the first nozzle is configured to supply a mixed gas of a fluorine-containing gas and a gas containing oxygen and nitrogen as the first cleaning gas, and
wherein the second nozzle is configured to supply a hydrogen fluoride gas as the second cleaning gas.

5. The substrate processing apparatus according to claim 1, wherein a temperature of the first region is set at 200 degrees C. or higher and 400 degrees C. or lower, and a temperature of the second region is set at 5 degrees C. or higher and 75 degrees C. or lower.

6. The substrate processing apparatus according to claim 1, further comprising a heater configured to heat the first region,
wherein the controller is configured to control at least one selected from the group of the gas supplier and the heater to clean the first region and the second region in parallel under different conditions by at least two methods selected from the group of the method in which the gas supplier supplies the two different kinds of cleaning gases, a method in which the gas supplier supplies one or more cleaning gases from two different locations, and a method in which the heater sets a temperature differently between the first region and the second region.

7. The substrate processing apparatus according to claim 1,
wherein the gas supplier includes:
a first nozzle configured to supply a first cleaning gas from near a region in which the substrate is arranged at a center portion of the reaction vessel; and
a second nozzle configured to supply a second cleaning gas from near the opening portion of the reaction vessel, and
wherein the cooler is configured to cool an entire circumference of the opening portion of the reaction vessel at 5 degrees C. or higher and 75 degrees C. or lower in a state in which a temperature at the center portion of the reaction vessel is 200 degrees C. or higher and 400 degrees C. or lower when performing the cleaning at the same time.

8. The substrate processing apparatus according to claim 1, further comprising a heater configured to heat the first region,
wherein the controller is configured to control at least one selected from the group of the gas supplier and the heater to clean the first region and the second region in parallel under different conditions, by the method in which the gas supplier supplies the two different kinds of cleaning gases, a method in which the gas supplier supplies one or more cleaning gases from two different locations, and a method in which the heater sets a temperature differently between the first region and the second region.

9. The substrate processing apparatus according to claim 7, wherein the first cleaning gas includes a $F_2$ gas.

10. The substrate processing apparatus according to claim 7, wherein the first cleaning gas includes nitric oxide.

11. The substrate processing apparatus according to claim 7, wherein the second cleaning gas includes hydrogen fluoride.

12. The substrate processing apparatus according to claim 1,
wherein a first nozzle is disposed parallel to a tube axis along an inner surface of the reaction tube, and is configured to discharge a mixed gas of a fluorine-containing gas and a gas containing oxygen and nitrogen as a first cleaning gas in a direction perpendicular to the tube axis, and
wherein a second nozzle is configured to discharge hydrogen fluoride as a second cleaning gas in a circumferential direction of the inlet flange.

13. The substrate processing apparatus according to claim 1, wherein the controller is configured to supply a first cleaning gas and a second cleaning gas by one of a method of simultaneously supplying the first cleaning gas to be supplied to the first region and the second cleaning gas to be supplied to the second region at a flow rate ratio of A:B, wherein A is 1 and B is 4 or more, a method of simultaneously supplying the first cleaning gas and the second cleaning gas at a flow rate ratio of C:D, wherein C is 4 or more and D is 1, and a method of alternately supplying the first cleaning gas and the second cleaning gas.

14. A method of manufacturing a semiconductor device using a substrate processing apparatus that comprises:
- a reaction vessel including a first region in which a substrate is arranged and a second region in which no substrate is arranged;
- a gas supplier configured to supply a plurality of gases including cleaning gases that clean an interior of the reaction vessel;
- a controller that controls the gas supplier; and
- a cooler configured to cool an opening portion of the reaction vessel,
- wherein the reaction vessel includes:
  - a reaction tube made of a heat resistant and corrosion resistant material; and
  - an inlet flange including a port configured to connect an opening of the reaction tube to an opening of the reaction vessel and to introduce the cleaning gases into the reaction vessel,
- wherein the cooler is installed so as to make contact with a substantially entire circumference of the opening of the reaction vessel, and the opening portion of the reaction vessel is cooled by allowing a cooling medium to flow through the cooler, and
- wherein an inner surface of the inlet flange is maintained at 200 degrees C. or higher when processing the substrate, and
- wherein the method comprises:
- processing the substrate at the first region within the reaction vessel including the first region in which the substrate is arranged and the second region in which no substrate is arranged; and
- controlling, by the controller, the gas supplier to clean the first region and the second region in parallel under different conditions by a method in which the gas supplier supplies two different kinds of cleaning gases.

* * * * *